(12) United States Patent
Lee et al.

(10) Patent No.: US 8,713,497 B2
(45) Date of Patent: Apr. 29, 2014

(54) METHOD OF GENERATING INTEGRATED CIRCUIT MODEL

(71) Applicant: Realtek Semiconductor Corp., HsinChu (TW)

(72) Inventors: Meng-Jung Lee, Taoyuan County (TW); Ting-Hsiung Wang, Kaohsiung (TW); Yu-Lan Lo, Hsinchu County (TW); Shu-Yi Kao, Hsinchu County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 13/732,422

(22) Filed: Jan. 1, 2013

(65) Prior Publication Data

US 2013/0185683 A1    Jul. 18, 2013

(30) Foreign Application Priority Data

Jan. 13, 2012    (TW) .............................. 101101352 A

(51) Int. Cl.
*G06F 17/50*    (2006.01)
(52) U.S. Cl.
USPC ........................................................ 716/110

(58) Field of Classification Search
USPC ................................................. 716/100, 110
See application file for complete search history.

(56) References Cited

U.S. PATENT DOCUMENTS

| 6,577,992 | B1* | 6/2003 | Deng et al. ...................... 703/14 |
| 7,392,170 | B1* | 6/2008 | McGaughy et al. ............. 703/14 |
| 7,818,158 | B2 | 10/2010 | McDonald |
| 8,428,928 | B1* | 4/2013 | McGaughy ....................... 703/14 |
| 2005/0027491 | A1* | 2/2005 | Fertner et al. .................. 702/196 |
| 2011/0161910 | A1* | 6/2011 | Ogata et al. .................... 716/136 |

FOREIGN PATENT DOCUMENTS

TW    201122869    7/2011

* cited by examiner

*Primary Examiner* — Suchin Parihar
(74) *Attorney, Agent, or Firm* — Winston Hsu; Scott Margo

(57) ABSTRACT

An integrated circuit test model is generated according to a circuit connection net-list, an isolation cell topology, and a pin voltage information spec file, so that the procedure of generating the integrated circuit test model can be time-saving, efficient, and fool-proof. Besides, while tracing a current path of a node of the circuit connection net-list, the generated integrated circuit test model can be more precise if certain limitations are added.

9 Claims, 7 Drawing Sheets

METHOD OF GENERATING INTEGRATED CIRCUIT MODEL

BACKGROUND OF THE INVENTION

1. Field of the Invention

The present invention relates to a method of generating an integrated circuit model, and more particularly, a method of generating the integrated circuit model by tracing current paths originated from nodes on a circuit connection net-list.

2. Description of the Prior Art

In conventional tests or simulations on an integrated circuit, confirming power domains for interface pins in the integrated circuit, isolation information of the power domain, and accurate operating voltages of the power domain are commonly performed tasks.

However, in these tests or simulations on the integrated circuit, information about the power domain or the operating voltages are required to be set manually, i.e., engineers for designing these tests or simulations are required to judge and input the information about the power domain or the operating voltage by himself or herself. Some defects may occur because: (1) There may be leakages occurring on paths between an interface pin and its corresponding power node or its corresponding ground node; (2) It takes too long to test or to simulate each interface pin; (3) Certain interface pins may be missed while establishing an interface pin list.

During tests or simulations on an integrated circuit, the abovementioned isolation information is also required to be set manually. Manual setting the isolation information may cause defects such as: (1) It takes too long to test or to simulate each interface pin; (2) Certain information of isolated elements may be missed in an established integrated circuit voltage model so that errors occur in results of the tests or simulations. Besides, while performing isolation tests or simulations on the integrated circuit according to the manually-set isolation information, it is time-consuming to prepare to simulate the integrated circuit. Worse yet, at least two times of simulations may be required for ensuring certain elements which should be turned off can be turned off at precise timings. Therefore, time consumption cannot be neutralized while performing isolation tests or simulations on the integrated circuit according to the manually-set isolation information.

SUMMARY OF THE INVENTION

The claimed invention discloses a method of generating an integrated circuit model, which may be recorded in medium to be executed by a microprocessor. The method comprises generating a circuit isolation node file according to a circuit connection net-list and an isolation cell topology; generating an interface node voltage net-list according to the circuit connection net-list and a pin voltage information spec file; and generating an integrated circuit voltage model according to the circuit isolation node file and the interface node voltage net-list.

These and other objectives of the present invention will no doubt become obvious to those of ordinary skill in the art after reading the following detailed description of the preferred embodiment that is illustrated in the various figures and drawings.

DETAILED DESCRIPTION

For neutralizing the defect of erroneous information or a time-consuming process while testing or simulating an integrated circuit in the prior art, a method of generating an integrated circuit model is disclosed in the present invention.

Figure 1:
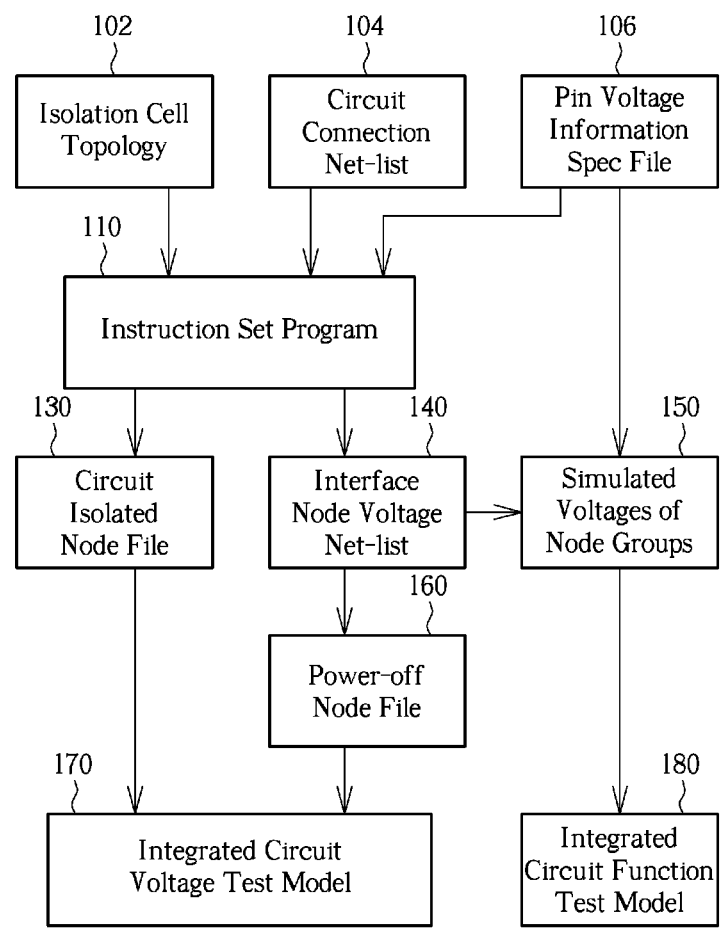
FIG. 1 illustrates a block diagram of how to generate an integrated circuit model according to one embodiment of the present invention.

Please refer to FIG. 1, which illustrates a block diagram of how to generate an integrated circuit model according to one embodiment of the present invention. As shown in FIG. 1, the integrated circuit model generated in the present invention primarily includes an integrated circuit voltage test model 170 and an integrated circuit function block test model 180.

In FIG. 1, a circuit connection net-list 104 is configured to record connection net-list between elements of an under-test integrated circuit. An isolation cell topology 102 is configured to record element connection characteristics of isolated elements and isolation nodes of the under-test integrated circuit, as an aid of determining whether elements of the under-test integrated circuit are isolated elements or whether there are isolated elements in the under-test integrated circuit. A pin voltage information spec file 106 is configured to record voltage levels occurring on interface pins of the under-test integrated circuit, such as upper-bound voltage levels, lower-bound voltage levels, or voltage levels under different operation modes.

An instruction set program 110 is configured to fetch a first set of instructions in correspondence with the circuit connection net-list 104 and the isolation cell topology 102, and is configured to load the circuit connection net-list 104 and the isolation cell topology 102 into the first set of instructions for testing, where the circuit connection net-list 104 and the isolation cell topology 102 serve as input parameters of the first set of instructions. As a result of testing, an interface node voltage net-list 140 containing interface pin voltage level information and circuit net-list information of the under-test integrated circuit is generated.

Similarly, the instruction set program 110 is configured to load a second set of instructions in correspondence with the isolation cell topology 102 and the circuit connection net-list 104, and is configured to load the isolation cell topology 102 and the circuit connection net-list 104 into the second set of instructions for testing, where the isolation cell topology 102 and the circuit connection 104 serve as input parameters of the second set of instructions. As a result, a circuit isolation node file 130 containing circuit net-list information and isolated element information of the under-test integrated circuit is generated.

According to one embodiment of the present invention, the abovementioned process of generating the circuit isolation node file 130 and the interface node voltage net-list 140 is performed by primarily tracing a current path started from each node on the circuit connection net-list 104.

Figure 2:
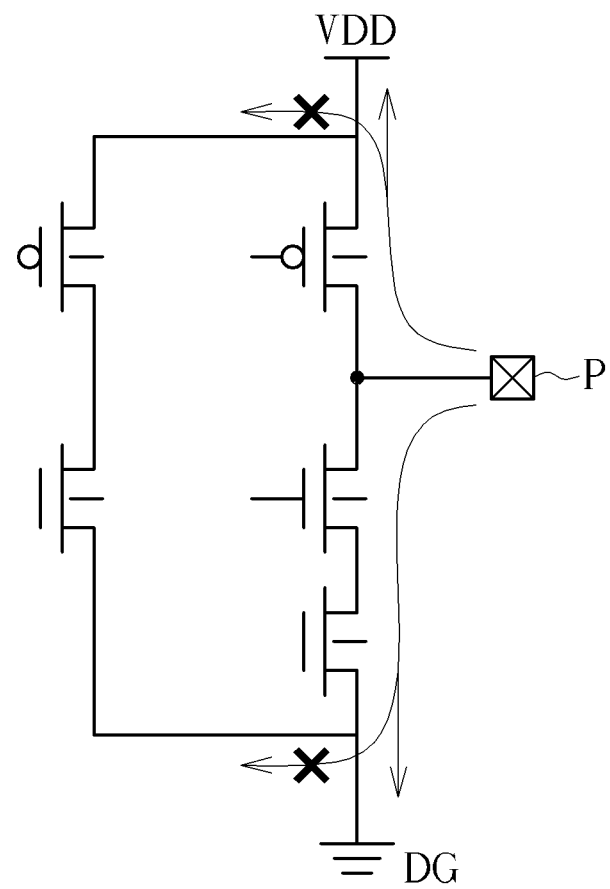
FIG. 2 illustrates how to determine a power node and a ground node for a node on a circuit connection net-list during generating the interface node voltage net-list shown in FIG. 1.

First, a primary purpose of the tracing of the current path started from each node on the circuit connection net-list 104 is to determine a power node and a ground node for each node during the process of generating the interface node voltage net-list 140. Please refer to FIG. 2, which illustrates how to determine a power node VDD and a ground node DG for a node P on the circuit connection net-list 104 during generating the interface node voltage net-list 140. During tracing a current path started from the node P, when the current path reaches a power terminal located by the power node VDD or a ground terminal located by the ground node DG, the tracing is stopped, and a combination of the node P, the power node VDD and the ground node DG is recorded in the interface node voltage net-list 140. Therefore, the interface node voltage net-list 140 may include a record of the combination saying that the node P has a corresponding power node VDD and a corresponding ground node DG.

Certain limitations for an input node or an output node are required during the abovementioned process of tracing. First, when a node on the circuit connection net-list 104 is regarded as an input node for being traced, a source and a drain of a MOSFET passed through by a current path started from the input node are restricted from being traced. When the node is regarded as an output node, a gate of a MOSFET passed through by a current path started from the output node is restricted from being traced. These limitations are related to a first property that the input node is configured to control a switch state of the MOSFET via its gate and a second property that the output node is configured to receive a current from the drain or the source of the MOSFET.

Figure 3:
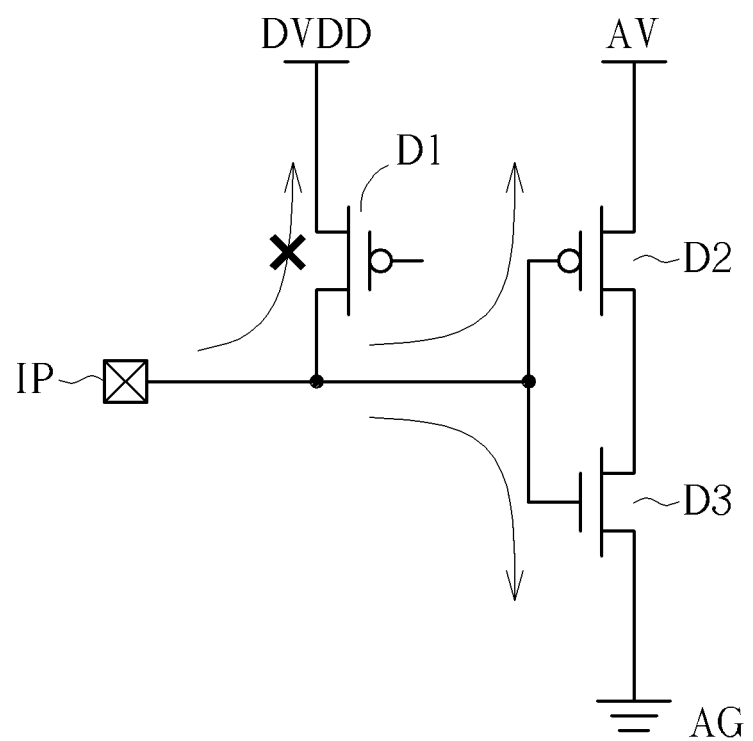
FIG. 3 illustrates how to trace a current path of an input node on a circuit connection net-list for determining a power node and a ground node corresponding to the input node.

Please refer to FIG. 3, which illustrates how to trace a current path of an input node IP on the circuit connection net-list 104 for determining a power node and a ground node corresponding to the input node IP. As shown in FIG. 3, a current path started from the input node IP is stopped from being traced after reaching a drain of a P-type MOSFET D1; therefore, a power node DVDD located at a source of the P-type MOSFET D1 is not determined to be a power node of the input node IP. When the current path started from the input node IP reaches a gate of a P-type MOSFET D2 and a gate of a N-type MOSFET D3, the current path is kept on being traced; therefore, a power node AV located at a source of the P-type MOSFET D2 is determined for the input node IP, and a ground node AG located at a source of the N-type MOSFET D3 is determined for the input node IP.

Figure 4:
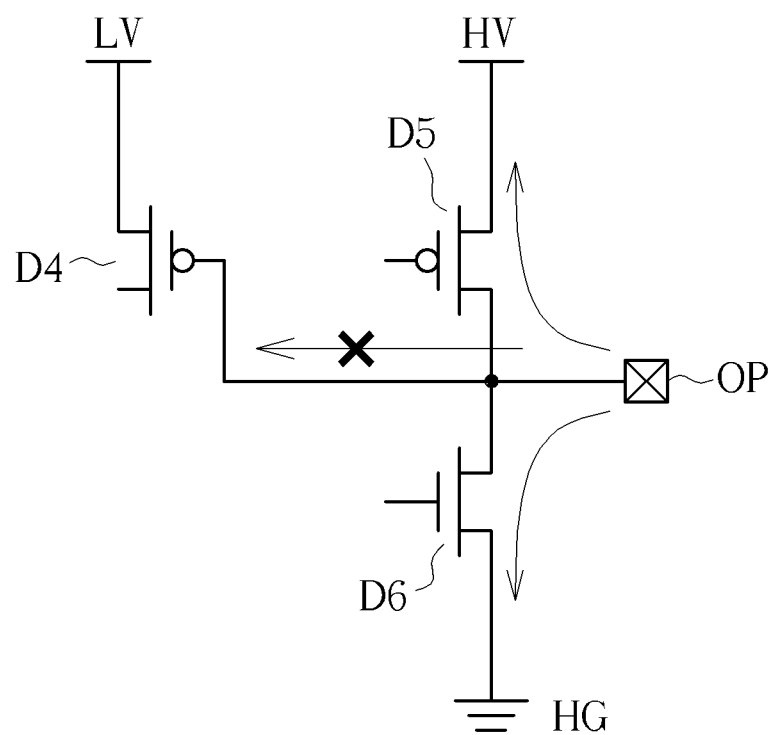
FIG. 4 illustrates how to trace a current path of an output node OP on a circuit connection net-list for determining a power node and a ground node for the output node.

Please refer to FIG. 4, which illustrates how to trace a current path of an output node OP on the circuit connection net-list 104 for determining a power node and a ground node for the output node OP. As shown in FIG. 4, a current path started from the output node OP is stopped from being traced after the current path reaches a gate of a P-type MOSFET D4; therefore, a power node LV located at a source of the P-type MOSFET D4 is not determined to be a power node of the output node OP. When the current path started from the output node OP reaches a drain of a P-type MOSFET D5 and a drain of a N-type MOSFET D6, the current path is kept on being traced; therefore, a power node located at a source of the P-type MOSFET D5 is determined for the output node OP, and a ground node HG located at a source of the N-type MOSFET D6 is determined for the output node OP.

Moreover, for clearly defining at least one internal power source generated on the circuit connection net-list 104, during the process of tracing a current path started from a node for determined a corresponding power node and a corresponding ground node, a low dropout regulator (LDO) representing the internal power source is required to be determined on the circuit connection net-list 104.

Figure 5:
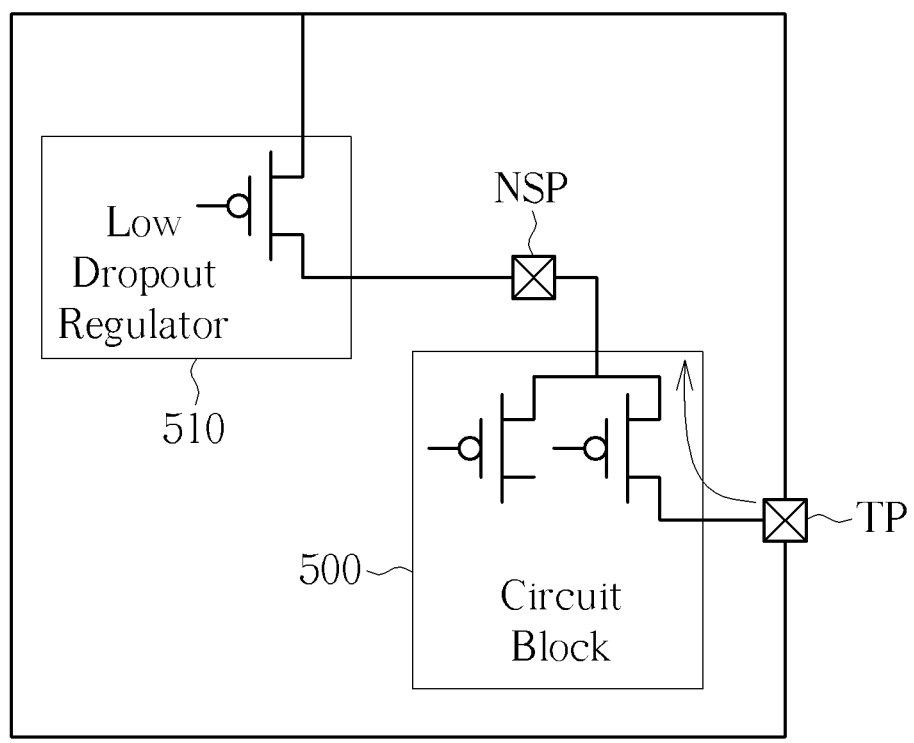
FIG. 5 illustrates how to determine a low dropout regulator to be a power node of a node on a circuit connection net-list during the process of tracing a current path started from the node for determining a corresponding power node and a corresponding ground node.
Figure 6:
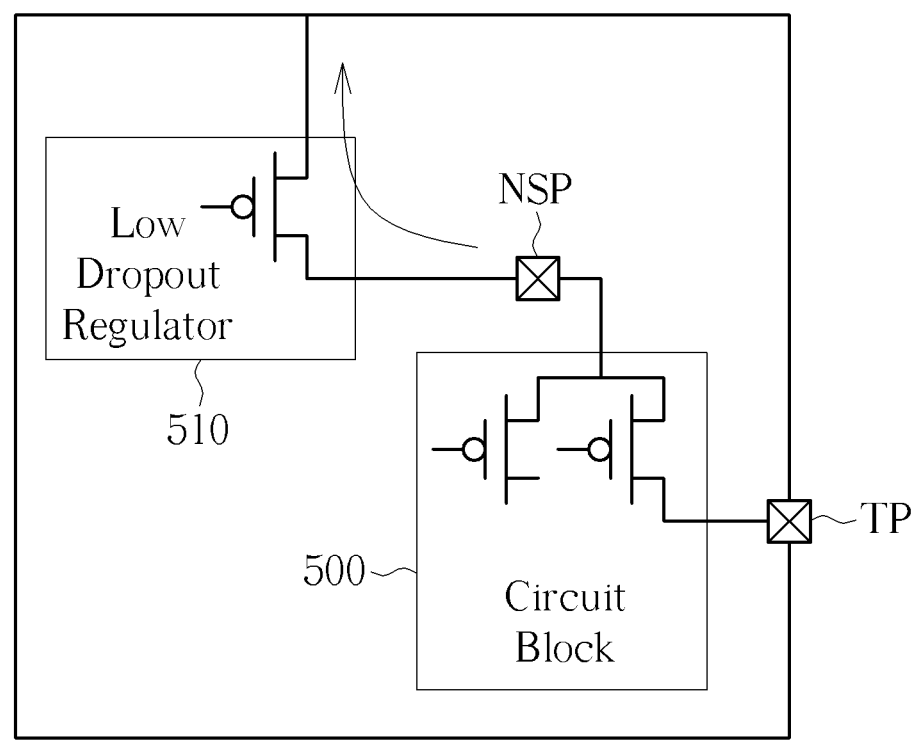
FIG. 6 illustrates how to trace a current path started from a node located at an input terminal of the low dropout regulator shown in FIG. 5 after determining the low dropout regulator to be the power node of the node in FIG. 5.

Please refer to FIG. 5, which illustrates how to determine a low dropout regulator 510 to be a power node of a node TP on the circuit connection net-list 104 during the process of tracing a current path started from the node TP for determining a corresponding power node and a corresponding ground node. Please also refer to FIG. 6, which illustrates how to trace a current path started from a node NSP located at an input terminal of the low dropout regulator 510 after determining the low dropout regulator 510 to be the power node of the node TP in FIG. 5. Note that in some embodiments of the present invention, elements shown inside a circuit block 500 in FIGS. 5-6 may be a combination of any circuit elements, and the elements shown inside of the low dropout regulator 510 may also be replaced by other elements configured to implement a low dropout regulator.

In FIG. 5, when the current path started from the node TP reaches the node NSP by passing through the circuit block 500, and when existence of the low dropout regulator 510 is determined via the circuit connection net-list 104, tracing of the current path of the node TP is stopped from being traced, and the node NSP is determined to be a power node of the node TP. Then in FIG. 6, a current path started from the node NSP is traced for determining a power node and a ground node for the node NSP. In one embodiment of the present invention, a current path started from a node at an output terminal of the low dropout regulator 510 may also be traced.

Figure 7:
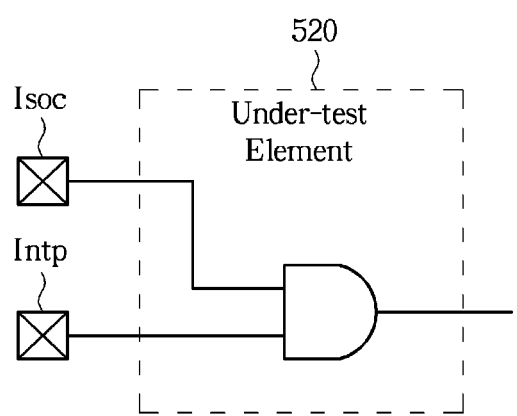
FIG. 7 illustrates how to determine whether an under-test element reached by a traced current path started from a node is an isolated element.

A primary purpose of tracing a current path started from each node on the circuit connection net-list 104 during the process of generating the circuit isolation node file 130 is to determine element matching characteristics of isolated elements recorded in the isolation cell topology 102, where elements matching the recorded characteristics are then determined to be isolated elements. An element on the circuit connection net-list 104 is determined to be an isolated element as long as the element is reached by a traced current path started from a node and has an input terminal connected to an isolated node recorded in the isolation cell topology 102. Please refer to FIG. 7, which illustrates how to determine whether an under-test element 520 reached by a traced current path started from a node Intp is an isolated element. Note that connection characteristics of isolated elements and locations of isolated nodes shown in FIG. 7 have been recorded in the isolation cell topology 102 in advance. As shown in FIG. 7, since an input terminal of the under-test element 520 is connected to an isolated node Isoc recorded by the isolation topology 102, the under-test element 520 matches characteristics of an isolated element and is determined to be an isolated element. Note that an event of determining the under-test element 520 to be an isolated element will also be recorded in the circuit isolation node file 130. Note that in some embodiments of the present invention, elements included by the under-test element 520 as shown in FIG. 7 may be a combination of any elements.

After the circuit isolation node file 130 and the interface node voltage net-list 140 are generated, an integrated circuit voltage test model 170 is generated according to the circuit isolation node file and the interface node voltage net-list 140. The integrated circuit voltage test model 170 includes information of the under-test integrated circuit, such as isolated element information and information of a power node and a ground node determined for each node.

In one embodiment of the present invention, during the process of generating the integrated voltage test model 170, information including switched-off under-test elements or nodes on the circuit connection net-list 104 may further be added into the interface node voltage net-list 140. As shown in FIG. 1, a power-off node file 160 may further be utilized for updating the interface node voltage net-list 140 so that the generated integrated circuit voltage test model 170 may further include test results of switched-off under-test elements or nodes under different test statuses. Note that the power-off node file 160 includes information about switched-off under-test elements or nodes on the circuit connection net-list that can be directly and dynamically set by engineers or according to different test requirements.

Additionally, while generating the integrated circuit function block model 180, simulation voltages 150 of node groups are generated according to the interface node voltage net-list 140 and a pin voltage information spec file 106, where a node group may include a combination of the input node IP and its power node AV and ground node AG mentioned in FIG. 3 or a combination of the output node OP and its corresponding power node HV and ground node FG mentioned in FIG. 4. By combining information of the node groups and voltage level information of interface pins of the under-test integrated circuit recorded in the pin voltage information spec file 106, simulated voltage levels for a node and its power node and ground node can be determined while operations of the under-test integrated circuit are simulated. At last, information of the simulated voltages 150 of the node groups and information of each circuit function block in the under-test integrated circuit are combined to generate an integrated circuit function block test model 180, which includes information of simulated voltages of each circuit function block while the under-test integrated circuit is simulated to operate.

With the aid of the method of generating an integrated circuit test model disclosed in the present invention, an integrated circuit test model may be generated according to different requirements and direct/automatic settings. Therefore, in comparison to the prior art, the present invention is time-saving, efficient and fool-proof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-transitory computer readable medium storing computer program instructions that, when executed by a microprocessor, cause the microprocessor to perform a method of generating an integrated circuit model, comprising:

generating, with the microprocessor, a circuit isolation node file according to a circuit connection net-list and an isolation cell topology, comprising:
executing at least one first instruction included by an instruction set program and taking the circuit connection net-list and the isolation cell topology as arguments of executing the at least one first instruction for generating the circuit isolation node file;

generating an interface node voltage net-list according to the circuit connection net-list and a pin voltage spec file, comprising:
executing at least one second instruction included by the instruction set program and taking the circuit connection net-list and the pin voltage spec file as arguments of executing the at least one second instruction for generating the interface node voltage net-list; and generating an integrated circuit voltage model according to the circuit isolation node file and the interface node voltage net-list.

2. A non-transitory computer readable medium storing computer program instructions that, when executed by a microprocessor, cause the microprocessor to perform a method of generating an integrated circuit model, comprising:

generating, with the microprocessor, a circuit isolation node file according to a circuit connection net-list and an isolation cell topology;

generating an interface node voltage net-list according to the circuit connection net-list and a pin voltage spec file, comprising:
tracing a current path started from a node included by the circuit connection net-list on the circuit connection net-list, and determining a power source node and a ground node both corresponding to the node according to voltage specs of each node included by the circuit connection net-list recorded in the pin voltage spec file; and
recording the node along with the power source node and the ground node for generating the interface node voltage net-list; and generating an integrated circuit voltage model according to the circuit isolation node file and the interface node voltage net-list.

3. The non-transitory computer readable medium of claim 2 wherein tracing the current path started from the node included by the circuit connection net-list on the circuit connection net-list and determining the power source node and the ground node both corresponding to the node according to the voltage specs of each node included by the circuit connection net-list recorded in the pin voltage spec file comprises:

stopping tracing a source or a drain of a MOSFET passed by the current path on the circuit connection net-list when the node is set to be an input node.

4. The non-transitory computer readable medium of claim 2 wherein tracing the current path started from the node included by the circuit connection net-list on the circuit connection net-list and determining the power source node and the ground node both corresponding to the node according to the voltage specs of each node included by the circuit connection net-list recorded in the pin voltage spec file comprises:

stopping tracing a gate of a MOSFET passed by the current path started from the node on the circuit connection net-list when the node is set to be an output node.

5. The non-transitory computer readable medium of claim 2 wherein tracing the current path started from the node included by the circuit connection net-list on the circuit connection net-list and determining the power source node and the ground node both corresponding to the node according to the voltage specs of each node included by the circuit connection net-list recorded in the pin voltage spec file comprises:

setting the power source node of the node to be at an input terminal or an output terminal of a low dropout regulator (LDO regulator) on the circuit connection net-list when the LDO regulator is passed by the current path started from the node on the circuit connection net-list; and tracing another current path started from the input terminal or the output terminal of the LDO regulator on the circuit connection net-list.

6. A non-transitory computer readable medium storing computer program instructions that, when executed by a microprocessor, cause the microprocessor to perform a method of generating an integrated circuit model, comprising:

generating, with the microprocessor, a circuit isolation node file according to a circuit connection net-list and an isolation cell topology, comprising:
tracing a current path started from a node included by the circuit connection net-list on the circuit connection net-list, and confirming whether an isolation element is passed by the current path on the circuit connection net-list according to at least one isolation node and element connection characteristics of isolation elements recorded by the isolation cell topology; and
recording the isolation element for generating the circuit isolation node file when the isolation element is confirmed to be passed by the current path on the circuit connection net-list;

generating an interface node voltage net-list according to the circuit connection net-list and a pin voltage spec file; and generating an integrated circuit voltage model according to the circuit isolation node file and the interface node voltage net-list.

7. The non-transitory computer readable medium of claim 6 wherein tracing the current path started from the node included by the circuit connection net-list on the circuit connection net-list and confirming whether the isolation element is passed by the current path on the circuit connection net-list according to the at least one isolation node and the element connection characteristics of the isolation elements recorded by the isolation cell topology comprises:
determining an element passed by the current path on the circuit connection net-list to be an isolation element when the element has an input terminal connected to one of the isolation elements recorded by the isolation cell topology so that the element matches element connection characteristics of the isolation elements recorded by the isolation cell topology.

8. A non-transitory computer readable medium storing computer program instructions that, when executed by a microprocessor, cause the microprocessor to perform a method of generating an integrated circuit model, comprising:

generating, with the microprocessor, a circuit isolation node file according to a circuit connection net-list and an isolation cell topology;

generating an interface node voltage net-list according to the circuit connection net-list and a pin voltage spec file;

generating an integrated circuit voltage model according to the circuit isolation node file and the interface node voltage net-list;

determining simulation voltages of a plurality of node groups included by the interface node voltage net-list according to the interface node voltage net-list and the pin voltage spec file, wherein each of the plurality of node groups comprises a node and both a power source node and a ground node corresponding to the node; and generating an integrated circuit functional block test model according to the simulation voltages of the plurality of groups.

9. A non-transitory computer readable medium storing computer program instructions that, when executed by a microprocessor, cause the microprocessor to perform a method of generating an integrated circuit model, comprising:

generating, with the microprocessor, a circuit isolation node file according to a circuit connection net-list and an isolation cell topology;

generating an interface node voltage net-list according to the circuit connection net-list and a pin voltage spec file; and generating an integrated circuit voltage model according to the circuit isolation node file and the interface node voltage net-list, comprising:
updating the interface node voltage net-list utilizing a power-off node file for generating an updated interface node voltage net-list; and
generating an integrated circuit voltage test model according to the circuit isolation node file and the updated interface node voltage net-list.

* * * * *